United States Patent [19]
Hartley

[11] Patent Number: 5,427,628
[45] Date of Patent: Jun. 27, 1995

[54] SOLAR RHYNO

[76] Inventor: Douglas J. Hartley, 3413 Utica Dr., Raleigh, N.C. 27609

[21] Appl. No.: 190,442

[22] Filed: Feb. 2, 1994

Related U.S. Application Data

[63] Continuation-in-part of Ser. No. 901,665, Jun. 22, 1992, abandoned.

[51] Int. Cl.$^6$ .......................................... H01L 31/052
[52] U.S. Cl. .................................................... 136/246
[58] Field of Search ........................................ 136/246

[56] References Cited

U.S. PATENT DOCUMENTS

| | | | |
|---|---|---|---|
| 4,003,756 | 1/1977 | Abrams | 136/246 |
| 4,361,758 | 11/1982 | Rotolo | 250/203.4 |
| 4,509,500 | 4/1985 | Mori | 126/578 |
| 4,668,841 | 5/1987 | Headrick | 136/246 |

FOREIGN PATENT DOCUMENTS

| | | | |
|---|---|---|---|
| 3-22573 | 1/1991 | Japan | 136/246 |
| 58-135683 | 8/1993 | Japan | 136/246 |
| 2063465 | 6/1981 | United Kingdom | 136/246 |
| WO92/13362 | 8/1992 | WIPO | 136/246 |

Primary Examiner—Aaron Weisstuch

[57] ABSTRACT

A geometric dome comprises a number of interconnected members which are arranged at specific angles. The geometric dome is excellent in strength due to the angular configuration of each member. One member of the dome is in the form of a convex lens and the rest of the dome is made up of two-way mirrors with the planes of the mirrors facing internally of the geometric dome. Sunlight is concentrated and directed to pass through the convex lens of the geometric dome. As concentrated sunlight passes through the convex lens, the light will be spread out internally of the geometric dome. Solar cells are arranged to face each other and receive light internally of the geometric dome, by means of the convex lens.

2 Claims, 5 Drawing Sheets

SOLAR RHYNO

This application is a continuation-in-part of application having Ser. No. 07/901,665 filed on Jun. 22, 1992, now abandoned.

BACKGROUND OF INVENTION

Collecting sunlight and transforming it to electricity by means of photovoltaic solar cells is a well understood technology today. For reasons of brevity, a description of solar electricity will not be given. The advantage of the present invention will come from the specific arrangement of said solar cells and in no way from the modification of solar cells. Presently there are a number of companies throughout the United States of America that sell solar cells for generation of electricity.

Due to photovoltaic solar cells typically having only one electrically producing face, the collectors must be positioned so that the surroundings such as trees or buildings, will not block the path between the sun and solar cells. This requirement is usually satisfied by positioning the solar cells in an open field or on top of a building. Another problem, which occurs with solar cells, is in the nature of reflection. Typically, a group of solar cells are positioned side-by-side; therefore sunlight has only one opportunity to be absorbed by the cells before reflections occurs.

Another problem occurs with the current solar cells because of the natural movement of the sun during different times of the day and the season of the year. Tracking the sun's actual position, regardless of time or season is possible, but only through an elaborate and expensive control system. Elaborate tracking systems can incur mechanical problems.

An example of a prior art silicon solar cell is illustrated in FIG. 1. Typically, plurality of solar electric cells are positioned side-by-side, therefore having only one opportunity to absorb light.

SUMMARY OF INVENTION

The present invention contrasts sharply with the current side-by-side arrangement of solar cells. The present invention relates to an improved mounting and support structure for housing solar cells. The present invention also relates to an improved means for concentration of sunlight for solar cells. The advantage of the present invention will come from the specific arrangement of solar cells and an improved concentration of sunlight. The advantages of the present invention do not arise from the modification of currently available solar cells.

The present invention may be accomplished by combining a number of interconnected angular members into a structure which serves as the housing and support structure for the solar cells. Solar cells are attached to specific members of the housing structure.

In contrast to the side-by-side arrangement, the solar cells in the present invention are in facing relation to each other.

A solar energy collection apparatus embodying the present invention comprises a housing structure made up of as number of interconnected angular members. All interconnected angular members are made up of two-way mirrors, with the plane of each mirror facing internally of the housing structure. The interconnected angular members define a light receiving surface which serves as a peripheral edge of which solar rays are allowed to penetrate through any of the interconnected angular members.

In accordance with the present invention, the collection apparatus includes a cooperating combination of a convex lens providing a generally conical projection of concentrated sunlight to be directed internally of the housing structure. The convex lens is specifically an interconnected angular member of the housing structure and serves as another entrance for incident light.

Another device of the present invention includes an arrangement of cooperating pairs of solar cells in facing relation attached to opposite sides of the housing structure and having a general dome shape.

In view of the above, an object of the present invention is to provide a solar energy collection apparatus which includes an improved polyhedral housing structure which will assist in support and arrangement of solar cells.

Another object of the present invention to increase the efficiency of the solar cells. Improvement in efficiency will come from an improvement of capacity to absorb sunlight by means of an arrangement of solar cells.

Other objects, together with the foregoing, are attained in the embodiments described in the following description and illustrated in the accompanying drawings.

DETAILED DESCRIPTION OF THE INVENTION

All interconnected angular members are made of two-way mirrors. The mirror plane will face internally of the geometric dome thus allowing light to enter through all sides of the geometric dome. All interconnected members must be specifically angled so the structure will form a dome with mechanical strength.

Figure 4:
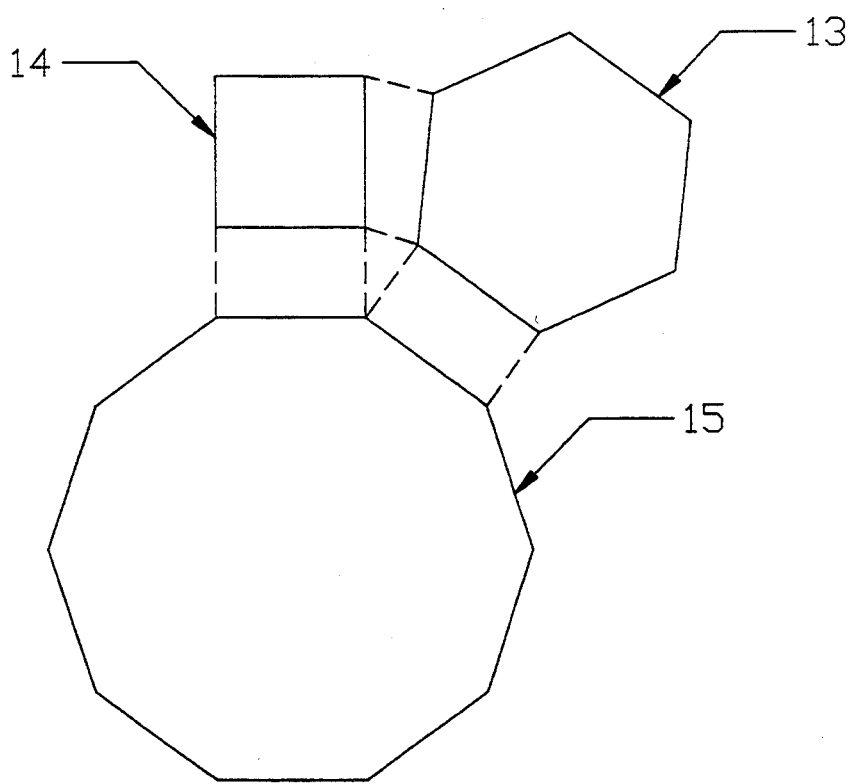
FIG. 4 is a partial and exploded view of interconnected angular shapes which are made up of two-way mirrors with their planar surfaces directed inside.
Figure 5:
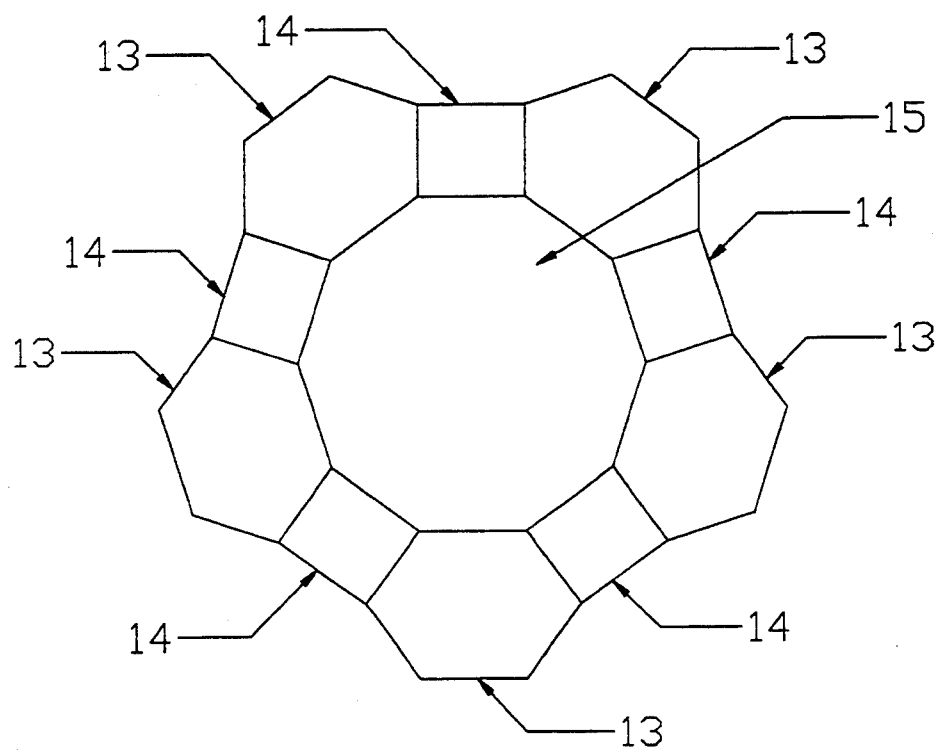
FIG. 5 is a partial and external view of interconnected angular shapes, slightly more advanced than that of FIG. 4.
Figure 6:
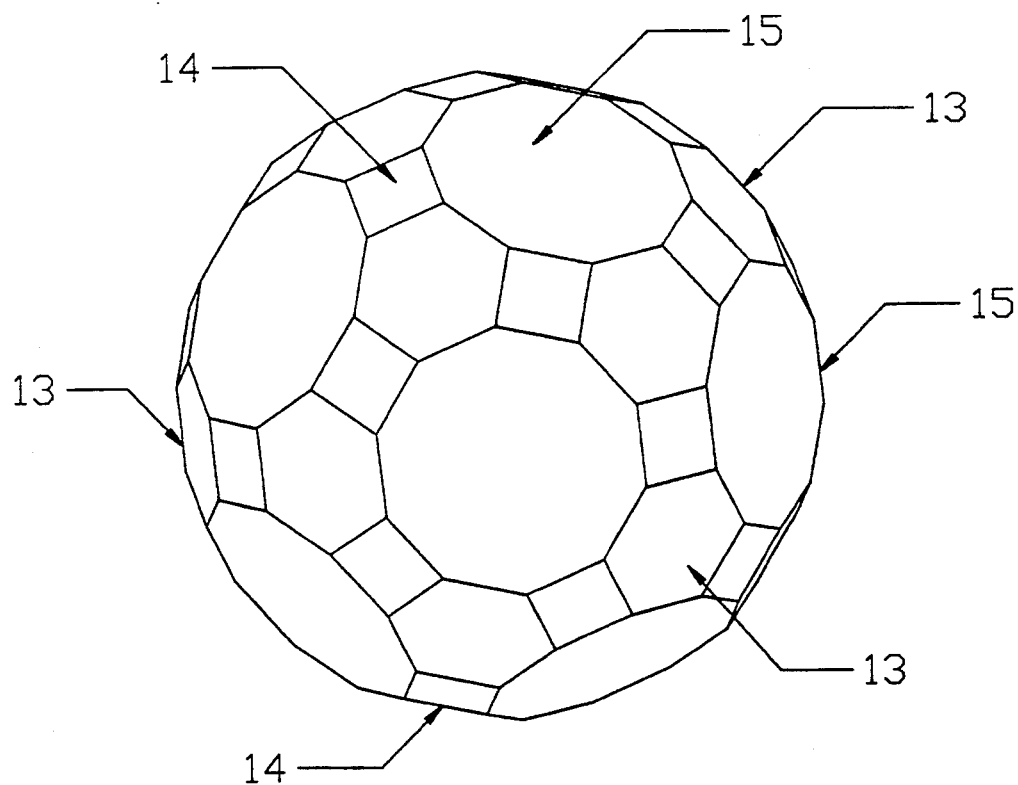
FIG. 6 is an external view of a housing structure which consists of the interconnected angular shapes, slightly more advanced than that of FIG. 5.
Figure 7:
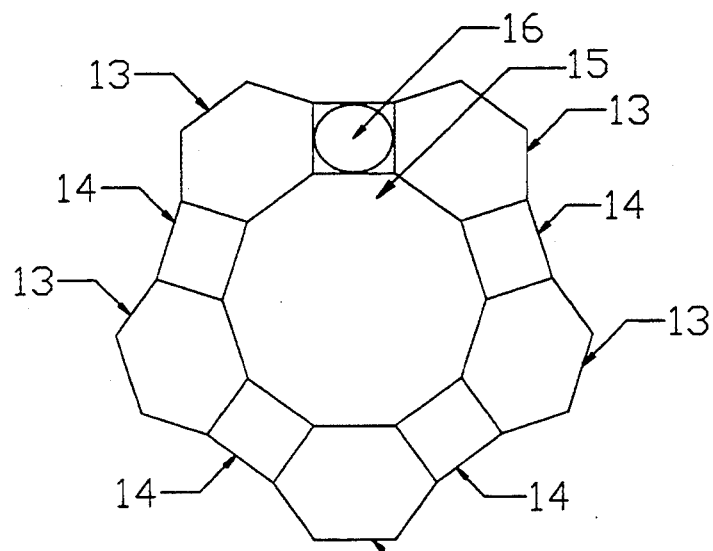
FIG. 7 is a partial and external view of FIG. 5 with one of the interconnected angular shapes replaced with a convex lens.
Figure 8:
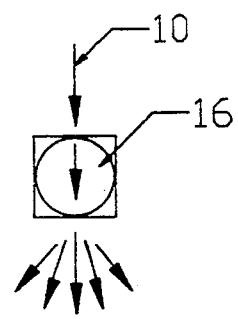
FIG. 8 is a convex lens shaped to be substituted as one of the interconnected angular shaped squares.
Figure 9:
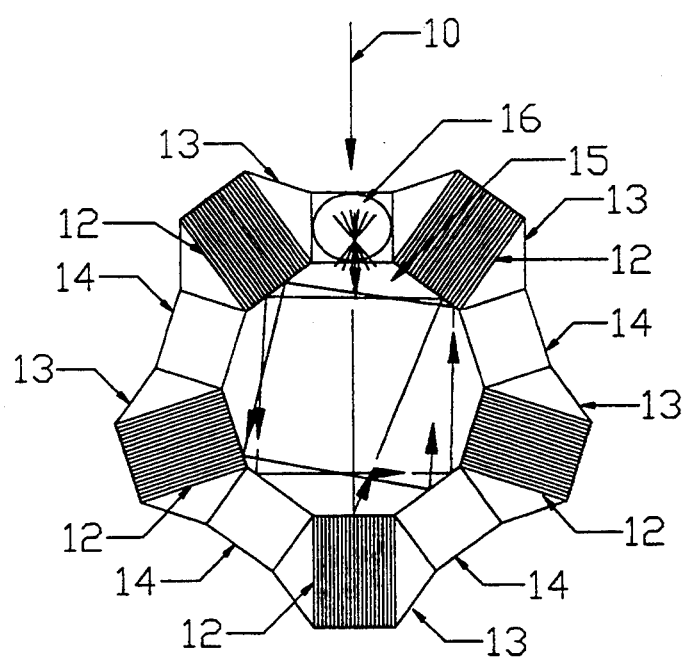
FIG. 9 is an internal view of FIG. 5, showing incident light 10 passing through a convex lens and reflecting internally off either solar cells or a section of the dome.
Figure 10:
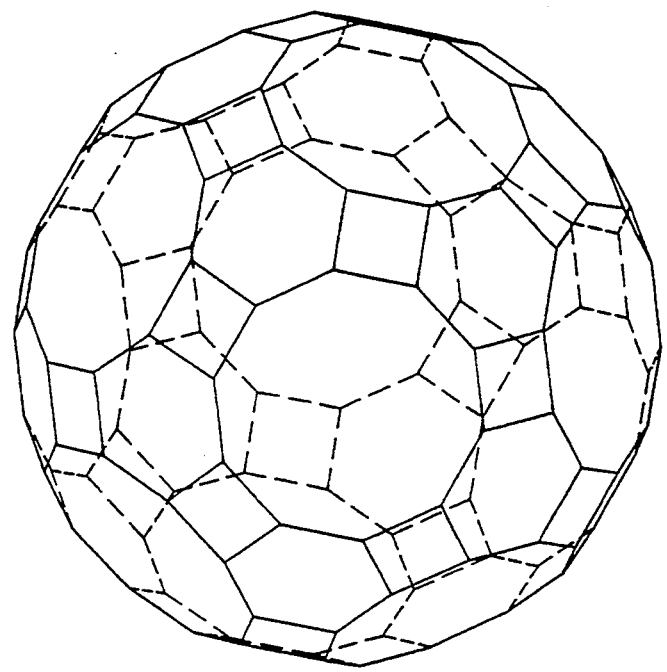
FIG. 10 is a perspective view of FIG. 6.
Figure 11:
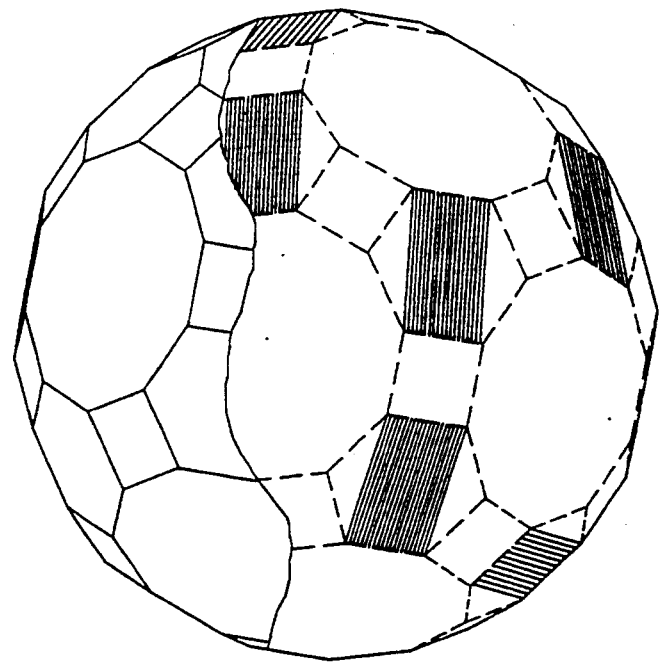
FIG. 11 is a cut away perspective view of FIG. 6 showing internal attachment of solar cells.
Figures 12, 13:
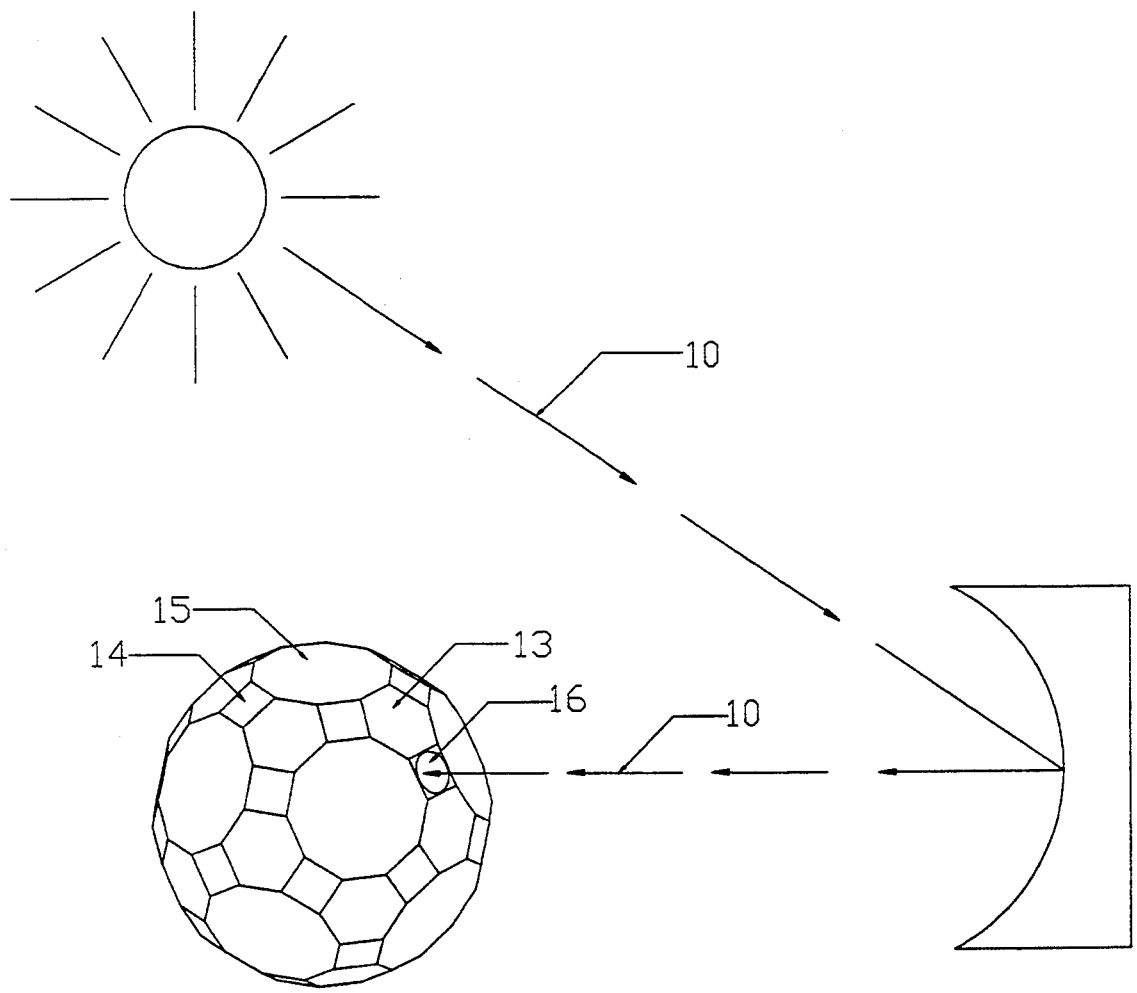
FIG. 12 is an external view with a convex lens positioned so it faces West.
FIG. 13 is a view of a concave mirror positioned to intercept and direct incident to pass through the convex lens of the geometric dome.

There will be a total of sixty-two interconnected angled members, thirty of which are in specific form of a square 14 shown in FIG. 4, with one in the specific form of a convex lens 16, which is represented in FIG. 8.

Figure 1:
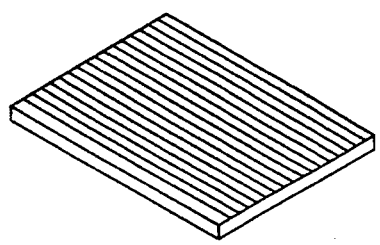
FIG. 1 is a perspective view of a prior art electricity producing solar cell.
Figure 3:
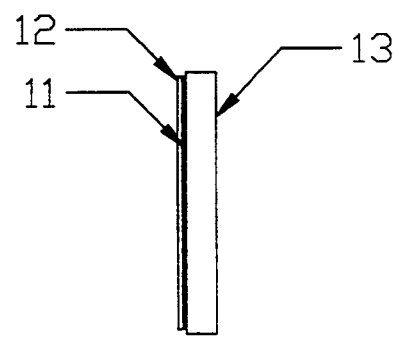
FIG. 3 is a side view of FIG. 2.
Figure 2:
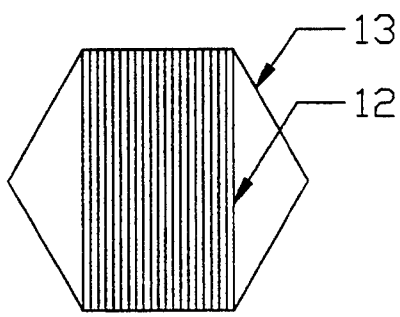
FIG. 2 is a view of prior art cell of FIG. 1 attached with a specific member of interconnected angular shape.

There will be twenty hexagons 13, as shown in FIG. 4. A solar cell as shown in FIG. 1 will be attached to hexagons 12 in FIG. 2. There will be twelve decagons 15 as shown in FIG. 4. The dihedral angles are as follows: 148° 17′ (decagon-square), 142° 37′ (decagon-hexagon), 159° 6′ (hexagon-square).

A specific interconnected part of the structure will be in the form of a convex lens 16. The lens is shown in FIG. 8. One must be able to substitute lenses for squares on the dome surface; the cooperation of the convex lens incorporated into the structure is paramount for the specific purpose of concentrating sunlight inside the geometric dome. Like the solar cell shown in FIG. 1, a convex lens, shown in FIG. 8, is also available commercially. The convex lens must be the same size as the other interconnected squares which make up a portion of the geometric dome. This concentrator of sunlight is advantageously used in the present invention. The convex lens concentrates the sunlight in a conical shape instead of a pin-point shape. The convex lens does not need to have precise optical properties since the conical shape of sunlight is the advantage. Instead of a small spot, the convex lens 8 produces a wider light beam, which is represented in FIG. 8, which is directed inside of the dome.

What is claimed is:

1. A dome-shaped housing structure including a plurality of solar electric cells in the interior space thereof, comprising: a dome constructed from a number of interconnected members, said members being inclined at different angles to form a geometric dome; and a plurality of solar electric cells forming at least part of said interconnected members, said solar electric cells being disposed interiorly of said geometric dome; and at least one said interconnected member being a convex lens to allow solar energy to pass into the interior of said geometric dome.

2. The means of claim 1 wherein at least part of said interconnected members are two-way minors with planar surfaces disposed in different directions whereby sunlight can enter said geometric dome at all solar angles.

* * * * *